United States Patent
Nicolescu et al.

(10) Patent No.: US 8,883,246 B2
(45) Date of Patent: Nov. 11, 2014

(54) PLASMA ACTIVATED CHEMICAL VAPOUR DEPOSITION METHOD AND APPARATUS THEREFOR

(75) Inventors: Mihai Nicolescu, Lidingö (SE); Åke Hjalmarsson, Bromma (SE); Vladimir Kouznetsov, Nynäshamn (SE); Klim Kouznetsov, legal representative, Nynäshamn (SE)

(73) Assignee: Plasmatrix Materials AB, Stockholm (SE)

( * ) Notice: Subject to any disclaimer, the term of this patent is extended or adjusted under 35 U.S.C. 154(b) by 981 days.

(21) Appl. No.: 12/747,338

(22) PCT Filed: Dec. 12, 2008

(86) PCT No.: PCT/SE2008/000699
§ 371 (c)(1),
(2), (4) Date: Oct. 16, 2010

(87) PCT Pub. No.: WO2009/075629
PCT Pub. Date: Jun. 18, 2009

(65) Prior Publication Data
US 2011/0081477 A1    Apr. 7, 2011

(30) Foreign Application Priority Data
Dec. 12, 2007 (SE) ........................................ 0702770

(51) Int. Cl.
*C23C 16/52*    (2006.01)
*H01J 37/32*    (2006.01)
(Continued)

(52) U.S. Cl.
CPC ........... *H01J 37/32174* (2013.01); *C23C 14/22* (2013.01); *C23C 14/3485* (2013.01); *C23C 16/44* (2013.01); *C23C 16/515* (2013.01); *H01J 37/32091* (2013.01); *H01J 37/32559* (2013.01); *H01J 37/3467* (2013.01); *H01J 2237/3321* (2013.01)
USPC .............................................. 427/8; 427/571

(58) Field of Classification Search
CPC .. C23C 16/515; C23C 16/44; C23C 14/3485; H01J 37/3467
USPC ........................................ 427/8–10, 569–579
See application file for complete search history.

(56) References Cited

U.S. PATENT DOCUMENTS

| 6,296,742 B1 | 10/2001 | Kouznetsov |
| 2003/0091742 A1 | 5/2003 | Forget et al. |

(Continued)

FOREIGN PATENT DOCUMENTS

| JP | 2004244713 A | 9/2004 |
| JP | 2005022950 A | 1/2005 |

(Continued)

OTHER PUBLICATIONS

International Search Report for PCT/SE2008/000699 mailed May 12, 2009.
(Continued)

*Primary Examiner* — Elizabeth Burkhart
(74) *Attorney, Agent, or Firm* — Patent Portfolio Builders PLLC

(57) ABSTRACT

In plasma activated chemical vapour deposition a plasma decomposition unit is used that is arranged in or connected to a vacuum vessel having a relatively low pressure or vacuum, to which an operating gas is provided. Periodically repeated voltage pulses are applied between the anode and the cathode of the plasma decomposition unit in such a manner that pulsed electric discharges are produced between the cathode and the surrounding anode of the plasma decomposition unit. The anode is arranged in a special way so that at least a portion thereof will obtain only an electrically conductive coating or substantially no coating when operating the unit. For that purpose, the anode includes a portion located in the direct vicinity of the free surface of the cathode. The portion is a flange or edge portion which is located or extends over margins of the free surface of the cathode. In that way, the anode will include a portion that is shielded for direct coating with particles from the plasma formed and that hence will obtain e.g. substantially no dielectric coating at all.

13 Claims, 12 Drawing Sheets

(51) Int. Cl.
*C23C 14/22* (2006.01)
*C23C 14/34* (2006.01)
*C23C 16/44* (2006.01)
*C23C 16/515* (2006.01)
*H01J 37/34* (2006.01)

(56) References Cited

U.S. PATENT DOCUMENTS

| | | |
|---|---|---|
| 2004/0020760 A1 | 2/2004 | Kouznetsov |
| 2004/0060661 A1 | 4/2004 | Nishimoto et al. |
| 2004/0127067 A1 | 7/2004 | Dunham |
| 2004/0182323 A1* | 9/2004 | Saito et al. .................. 118/728 |
| 2006/0175197 A1* | 8/2006 | Chistyakov ................ 204/298.2 |
| 2007/0036895 A1 | 2/2007 | Carpenter et al. |

FOREIGN PATENT DOCUMENTS

| | | | |
|---|---|---|---|
| JP | 2005272948 A | | 10/2005 |
| JP | 2006093342 A | | 4/2006 |
| JP | 2006270097 A | | 10/2006 |
| KR | 960012316 B1 | | 9/1996 |
| KR | 960014905 B1 | | 10/1996 |
| RU | 2029411 C1 | | 2/1995 |
| RU | 2058429 C1 | | 4/1996 |
| WO | 0161070 A1 | | 1/2001 |
| WO | 2005050696 A1 | | 6/2005 |
| WO | 2006049566 A1 | | 5/2006 |
| WO | WO 2006/049566 | * | 5/2006 |
| WO | 2007024765 A1 | | 3/2007 |
| WO | 2008105736 A2 | | 9/2008 |

OTHER PUBLICATIONS

Tozer, B. A., et al., "Rotating Plasma," Proc. IEEE, vol. 112, No. 1, Jan. 1965, pp. 218-228.

Halbach, K., et al., "Production of a Hot Rotating Plasma," Physics Fluids 5, Jun. 1962, pp. 1482-1483.

Bocharov, V. N., et al., Abstract of "Equilibrium state of a rotating plasma in a mirror trap," Fizika Plazmy, vol. 4, May-Jun. 1978, pp. 488-491 published in Russian.

Konstantinov, S. G., et al., Abstract of "Measurement of the electric field of a rotating plasma," Fizika Plazmy, vol. 1, Sep.-Oct. 1975, pp. 802-805 published in Russian.

"High Power Impulse Magnetron Sputtering," http://en.wikipedia.org/wiki/High_Power_Impulse_Magnetron_Sputtering, downloaded Oct. 20, 2010, last updated Oct. 7, 2010, pp. 1-5.

D.V. Mozgrin, et al.; High-Current Low-Pressure Quasi-Stationary Discharge in a Magnetic Field: Experimental Research; Moscow Engineering Physics Institute, Kashirskoe sh. 31; Plasma Physics Reports, vol. 21 No. 5, pp. 400-409; Moscow, Russia 1995.

B. Lehnert; "Rotating Plasmas"; Nuclear Fusion 11, pp. 485-487; Royal Institute of Technology, Stockholm, Sweden; 1971.

J. Reece Roth; "Industrial Plasma Engineering, vol. 1: Principles"; 1995; pp. 337-340; Department of Electrical and Computer Engineering, University of Tennessee, Knoxville, TN; Institute of Physics Publishing, Bristol and Philadelphia, PA 19106.

* cited by examiner

Discharge current

Fig. 2a
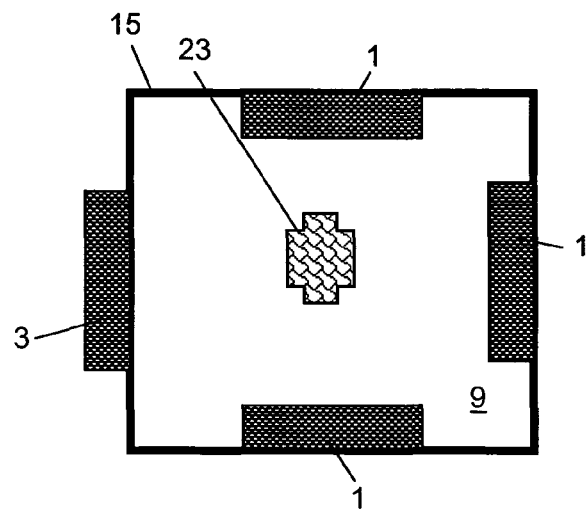
Fig. 2b
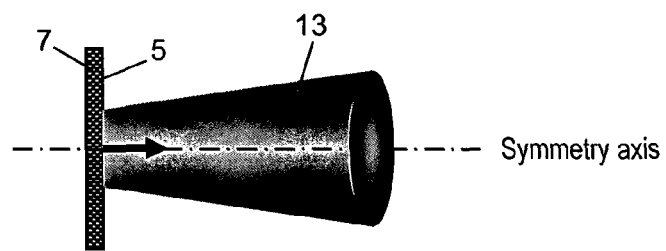
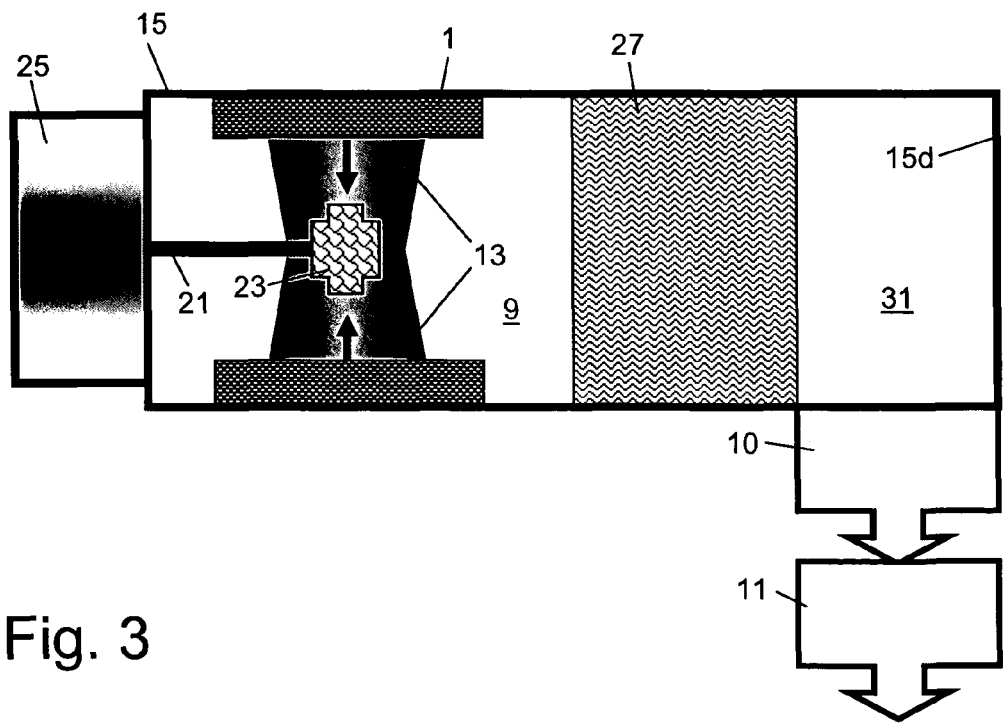
Fig. 3

High voltage, 200V/divisision

Low voltage

Glow to arc transition

Glow to arc transition

PLASMA ACTIVATED CHEMICAL VAPOUR DEPOSITION METHOD AND APPARATUS THEREFOR

RELATED APPLICATION

This application claims priority and benefit from Swedish patent application No. 0702770-9, filed Dec. 12, 2007, the entire teachings of which are incorporated herein by reference.

TECHNICAL FIELD

The present invention relates to plasma technology for precipitation of or depositing material layers. The basic processes that are used in the invention include CVD and PVD.

BACKGROUND

The chemical vapour deposition (CVD) process was invented in the 1970s and has been continuously improved over the decades in order to respond to ever more demanding market requirements in terms of the coating process, structures and combinations.

The typical process temperature for classic CVD coatings is between 720° C. and 1050° C. The most common items coated are punches, metal forming tools, and extrusion dies. In terms of substrate materials due to the high temperature of the process, most steels will require a post coating heat treatment. The coatings typically deposited are TiC, TiCN, $Al_2O_3$. The coatings are almost always deposited as multi-layers.

The advantages of the process include

Possibility to coat complex geometries, including certain inner diameters

High loading capacity of certain tools (but long cycle times)

Items to be coated do not require rotation within the retort

Excellent coating uniformity, independent of part geometry

Extreme toughness of coatings

Initially CVD is known as heat-activated process which relies on the reaction of gaseous chemical compounds with suitably heated and prepared substrates. As it is written above it requires high substrate temperatures. To decrease the substrate temperature the different techniques initiating molecules decomposition (cracking) have been used. Most common this is the radio frequency (RF) initiated discharge in the process chamber, see the published Japanese patent application 20062700979. Among other techniques microwave CVD reactor, see the published U.S. patent application 2007/036895, DC CVD reactor, see the South Korean patent document KR960014905B, hybrid RF and DC reactor, see the South Korean patent document KR960012316B, pulse reactor, see the published Japanese patent application 2004244713, and others can be mentioned. Electric discharges in a CVD reactor results in ignition of the plasma. Therefore these kinds of the CVD are called plasma activated CVD (PA CVD) or plasma enhanced CVD (PE CVD). The use of PA CVD results in a significant reduction of the work piece temperature. It is for PA CVD in the range 100°-300° C. (compare to classic CVD). Since the electric discharges are used problems associated with the arc suppression and work piece biasing may be important, see the published International patent application WO 2007/024765 and the published Japanese patent application 2006093342.

The second problem in CVD technology is the CVD reactor design and optimization. The following main reactors geometry design can be mentioned.

The showerhead reactor, see the published U.S. patent application 2004127067

The tube reactor, see the published International patent application WO 01/61070

The reactor design varies according to the methods of plasma excitation used.

One of the important parts of the reactor is the cathode used in the electric discharge. In recent years magnetron-like cathodes have been used, see the published Japanese patent applications 2005/022950 and 2005/272948. The magnetron cathodes are typical parts of the physical vapour deposition (PVD) technology and devices. From this point of view the reactor combines CVD and PVD principles and can therefore be called a hybrid CVD-PVD reactor.

So, as one can see the active development of the CVD methods and devices is continuing over several decades. Still further development is required in all mentioned areas of the CVD technology. They include in particular: methods of the plasma excitation, reactor design and optimization, arc suppression and work pieces biasing.

The PA CVD, PA PVD and hybrid technologies are generally used for deposition of material layers onto work pieces. One of the decisive parameters is the deposition rate. The characteristic value of this parameter described for example in the published Japanese patent application 2006/270097 cited above is 790 nm/min. The plasma generation is accomplished by RF discharges. Modern technology requires deposition rates that are 10-20 times higher in order to deposit thick layers of about 1000 μm on the work pieces having large surfaces of complex shapes. Therefore, a crucial parameter is the cost of an industrial CVD coating machine. To achieve chip and efficient deposition using RF and microwave techniques is too expensive for work pieces of complex shapes requiring a large space.

The cheapest solution is the DC principle. The week side of this technique is the low deposition rate because of the low discharge current between the electrodes. To increase the discharge current a cathode having an enhancing magnetic field is used, see the published Japanese patent applications 2005/272948 and 2005/022950 cited above. Still this method is not enough to achieve a deposition rate more than about 10 μm/hour.

However, in the PA PVD technology high current magnetron sputtering is widely known, see U.S. Pat. No. 6,296,742, the published International patent application WO 2006/049566 and the published U.S. patent application 2004/020760. The week side of high current magnetron sputtering is the fact that by increase of the discharge current the deposition rate proportionally decreases, compare the published International patent application WO 2005/050696, FIG. 2a. On the other side, the sputtered vapour ionization increases.

There are five main problems that may have to be solved in order to achieve efficient use of high current low duty cycle electric discharges for complex molecules decomposition in a CVD reactor.

1. High plasma density. The decomposition in PA CVD is produced by molecules colliding with electrons available in plasma. After decomposition radicals consisting of solid species such as Si, C are deposited onto work pieces. To achieve a high deposition rate it is necessary to get a high electron density in the generated plasma. Because of the general quasi-neutrality of plasmas it means that it is necessary to achieve a high plasma density. This can be achieved by pulsed, high current, low duty cycle electric discharges between electrodes in a PA CVD reactor
2. High electron energy. It is necessary to achieve an electron energy sufficient for molecules decomposition. The characteristic energy required is in the range of few electronvolts up to a few dozens of electronvolts
3. Low cathode erosion. Because of the sputtering effect the cathode of discharge gap is eroded which results in the necessity for periodically replacing the cathode with a fresh one. Actually, the deposition rate from cathode sputtering is less than 10% of the total deposition rate. It is still a significant portion and the parasitic effect of cathode sputtering hence has to be minimized.
4. Electrode design. In most applications the deposited layers of materials have a very low electrical conductivity or are almost dielectric. These materials cover the surfaces of the electrodes and make them electrically non-conductive. The main part of problem relates to the anode of the discharges since the cathode can be sufficiently cleaned by sputtering. The dielectric layer makes the discharges impossible. This phenomenon is also parasitic and a specific electrode design is required.
5. Arc suppression. Existence of layers having a low electric conductivity or dielectric layers at the electrodes also results in a random transformation of diffused glow discharges into arc discharges. It destroys the deposition process and layers on the work pieces. Therefore, arc suppression is required.

SUMMARY

It is an object of the invention to provide efficient methods for CVD and similar processes.

It is another object of the invention to provide efficient apparatus and components thereof for CVD and similar processes.

Each of the problems described in the points 1-5 above may be reduced or even minimized, alone or in combination with some other problem or problems, using the methods and devices as described herein, at least in some cases. A principle used is transformation of the high voltage diffused glow discharges into low voltage diffused glow discharges by suitable combinations of the following parameters:
The dimensions of the CVD reactor
The magnetic field strength
The value of the discharge current It was found that by increasing the discharge current between the same electrodes in the PA CVD process the deposition rate increases proportionally to the increase of the electrical current. As well, the ionization rate of the gas coming into discharge is increased.

It was further found that if the values of these parameters are correctly chosen the discharge voltage can be e.g. about 70 V. The discharges are distributed almost uniformly across the cathode surface. Such low voltage discharges are still sufficiently cleaning/sputtering the cathode surface. The electron density is up to $10^{21}$ m$^{-2}$ and the electron temperature is up to 20 eV.

It was found that a discharge cell with a plasma having these parameters is a very efficient CVD reactor. The geometry of the discharge electrodes, gas supply system and vacuum system may also be optimized as will be described below.

Use of the methods and devices described herein may result in achieving a CVD deposition rate about 200-300 μm/hour for layers of carbon based materials and about 1000 μm/hour for PVD. The methods and devices described herein may allow deposition of thick layers of materials. The characteristic layer thickness may e.g. be about 1-2 mm.

In one exemplary aspect, a plasma decomposition unit is used for plasma activated chemical vapour deposition, the unit as conventional arranged in or connected to a vacuum vessel having a relatively low pressure or vacuum, to which an operating gas is provided. Periodically repeated voltage pulses of a single polarity are applied between the anode and the cathode of the plasma decomposition unit in such a manner that pulsed electric discharges are produced between the cathode and the anode of the plasma decomposition unit. The anode is configured in a special way so that at least a portion thereof will obtain only an electrically conductive coating or substantially no coating of deposited material when operating the unit. For that purpose, the anode may include a portion such as a flange or an edge portion that is located in the direct vicinity of the free surface of the cathode and is located or extends over margins of the free surface of the cathode. In that way, the anode will include a portion that is shielded from direct coating with particles from the plasma formed and that hence will obtain e.g. substantially no dielectric coating at all.

In another aspect, a method of plasma activated chemical vapour deposition and similar deposition methods generally comprises the following five steps:
Providing a vacuum vessel in which there is a relatively low pressure or vacuum and to which an operating gas such as a mixture of a decomposition or precursor gas, a reactive gas and/or a sputter gases is provided.
Providing a plasma decomposition unit that is arranged in or is connected to the vacuum vessel and works for decomposing the complex molecules of the operating gas having into charged or neutral radicals. The plasma decomposition unit has an anode and a cathode. It can also be said to have its own anode and cathode spaces, so that the anode surrounds the cathode space. The cathode is provided with an enhancing magnetic field and is electrically insulated from the surrounding anode.
Providing a work piece processing unit that includes a processing chamber. The processing chamber and the anode and cathode spaces are in direct communication. For example, the processing chamber can be identical to the processing chamber, be a portion thereof or be connected thereto.
Providing a work piece in the processing chamber.
Applying periodically repeated voltage pulses between the anode and the cathode of the plasma decomposition unit in such a manner that pulsed electric discharges are produced between the cathode and the anode of the plasma decomposition unit.

In particular, it can be arranged so that in operation the discharges occur between the cathode and particularly or primarily an inner surface of the surrounding anode. Even more specifically, the anode can be configured so that at least a portion thereof will obtain only an electrically conductive coating or substantially no coating at all when the plasma decomposition unit and work piece processing unit are operated. The anode may for this purpose include a portion shielded for direct coating with particles from the plasma formed.

In another aspect, the processing chamber can be divided in two separate parts by a filter or trap for precipitation and recombination of solid and volatile radicals. Vacuum pumps that are arranged to maintain the low pressure in the vacuum vessel may be protected from such radicals if they are connected on the "clean" side of the radical filter or trap.

In operation, the operating gas generally has molecules that includes of atoms of solids. The operating gas diffuses into the plasma beam and is decomposed by collisions with electrons of the plasma. The operating gas mixture may be supplied into the processing chamber with a time constant flow or a time variable flow.

Furthermore, the method can include that the apparatus is configured and operated so that in operation the resistance of the discharge gap of the plasma decomposition unit is substantially inversely proportional to the discharge current value.

The work piece can in all cases be given a potential that is negative in relation to that of the anode.

In operation, parameters of the following ranges may be used, alone or in combination:

The pulsed discharges can have a characteristic repetition frequency in the range of 1 MHz-1 kHz The pulsed discharges can have a characteristic decay time in the range of 1-10 000 microseconds.

The electron energy of the plasma beam can be in the range of 1-30 eV.

The plasma density can be in the range of $10^{17}$-$10^{21}$ m$^{-2}$.

The operating pressure of the gas mixture can be in the range of $10^{-4}$-$10^1$ Torr.

The enhancing magnetic field strength can be in the range of 0.001-0.2 T.

The work piece can be placed in the area of the plasma beam at a distance within the range of 1-50 cm from the cathode surface.

In another aspect, in order to accomplish discharges between an anode and a cathode in a CVD or similar application current pulses can be applied, each or some of which is formed by adding low power current pulses to each other. The added pulses which are also called element pulses can have any suitable shape, in particular shapes that have a sharp peak. The resulting composite current pulses can e.g. have a substantially rectangular shape.

For example, for a suitable configuration of the electrodes and suitable operational parameters it can achieved that the discharge voltage is substantially constant during each such composite pulse.

For generating the added pulses, a generator may be provided that comprises a line of transformation of incoming power initially into the energy of an electric field, thereafter into the energy of a magnetic field, and finally again into the energy of an electric field.

Parameters of the following ranges for the added pulses may be used, alone or in combination:

The half-width of the added pulses can be in the range of $10^{-6}$-$10^{-2}$ seconds.

The added pulses can have a repetition frequency in the range of 1 MHz-1 kHz.

The amplitude of the added pulses can be in the range of $10^{-6}$-$10^3$ A.

The characteristic energy accumulated for forming of any of the single added pulses can be in the range of $10^{-6}$-100 J.

Parameters of the following ranges for the resulting, composite pulses may be used, alone or in combination:

The composite pulse time can be in the range of $10^{-6}$-100 seconds.

The composite pulse duty cycle can be in the range of 0.5-0.1.

The discharge voltage in the composite pulses can be varied from 50 V to 1000 V dependent on the gas mixture content, the pressure and the enhancing magnetic field strength.

The energy of the composite pulses can be within the range of 0.1-100 kJ.

The power of each composite pulse can be in the range of 1-100 kW.

In a plasma decomposition unit for producing a plasma used in CVD and similar applications in which only glow discharges are desired, arc suppression can be performed by short connecting the anode and cathode of the plasma decomposition unit before an actual occurrence of an electric arc. In particular, the discharge voltage and current may be analyzed for the possible appearance of high frequency, high amplitude oscillations to find whether there is a tendency of transformation of a glow discharge into an arc discharge.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinafter with reference to the accompanying drawings, in which:

FIG. 2a is a schematic top view of a process chamber including four plasma decomposition cells, FIG. 2b is a schematic of the gas decomposition area for the plasma decomposition cells of FIGS. 1a and 1b, FIG. 3 is a schematic of apparatus for CVD including a process chamber having two opposite plasma decomposition cells and a trap for generated radicals.

DETAILED DESCRIPTION

Figure 1A:
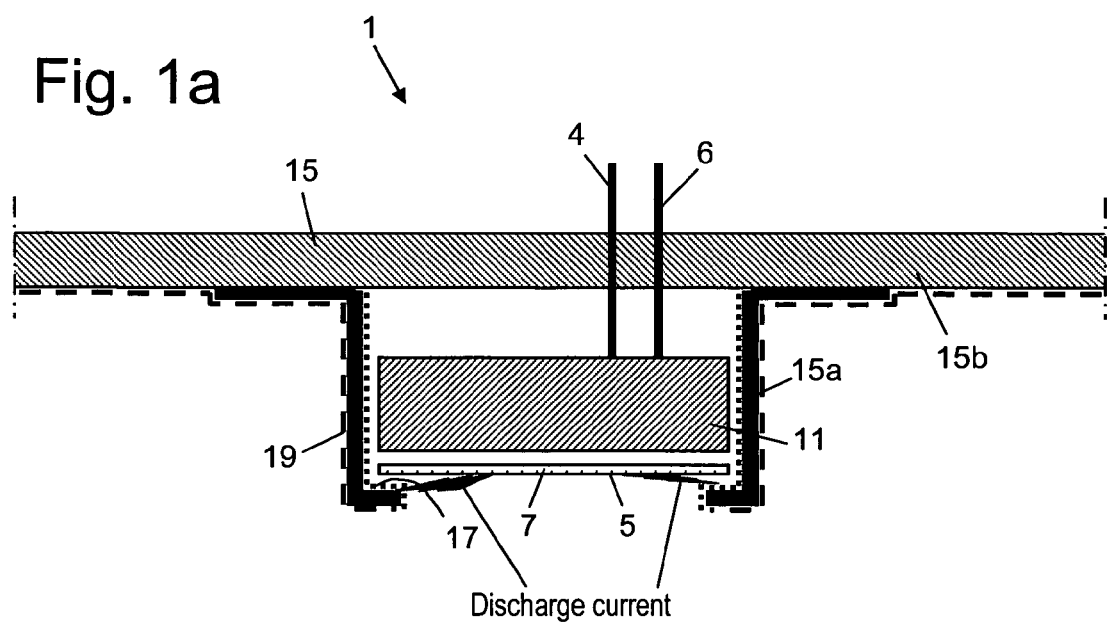
FIG. 1a is a schematic of a plasma decomposition cell for CVD that is internally mounted.

Plasma activated methods of chemical vapour deposition (PA CVD methods) are based on the dissociation, also called decomposition or disintegration, of molecules caused by collisions with electrons. The dissociation of molecules into new molecules, molecular fragments and charged or neutral radicals due to collisions with electrons requires that the energy of the electrons is in the magnitude of order of electronvolts, i.e. it is between the ranges of keV or meV. The different molecules, molecular ions and radicals used or produced have different dissociation energies. Generally, the dissociation energy is in the range of 1-100 eV for both partial or complete dissociation. Often it is in the range of 1-20 eV. It means that the plasma generated in a decomposition cell, also called decomposition unit or disintegration cell, has to contain electrons, the energy of which as a minimum is of the magnitude of order of a few electronvolts, e.g. at least 5 eV or generally in the range of 5-40 eV. In plasma fusion technology a plasma having such parameters is called a "cold plasma". It can be compared to a "hot plasma" that comprises electrons having energies in the range of 1-100 keV.

The various PA CVD methods comprise generation of a plasma that has a sufficient amount or concentration of energetic electrons to allow an effective decomposition of the operating gas used. The methods used for plasma generation in the PA CVD methods that are used in current industrial practice are based on electric discharges of any of the following kinds: DC, RF, microwave and pulsed. The winner in this competition will be the discharge technology that allows that energetic electrons are obtained in a chipset way and with the highest electron density and energy.

During the period since 1958 up to now no better technology for generation of cold plasmas has been found than the use of pulsed, high current discharges in crossed electric and magnetic fields. The most common experimental devices are the homopolar and homopolar-like devices, see K. Halback, W. R. Baker, R. W. Layman, "Production of a Hot Rotating Plasma", Physics Fluids 5 (1962) 1482. B. A. Tozer, "Rotating plasma", Proc. IEEE, Vol. 112, No. 1, Jan. 1965, and B. Lehnert in the review "Rotating Plasmas", Nuclear Fusion 11 (1971), pp. 485-533. In such devices the plasma density achieved is typically $10^{21}$ m$^{-3}$ and the electron energy ranges up to 100 eV. In modern technology devices of these kinds are called cylindrical post magnetrons and inverted cylindrical post magnetrons, see J. Reece Roth, "Industrial Plasma Engineering", Vol. 1, Institute of Physics Publishing, Bristol and Philadelphia, 1995, p. 339. In particular, during the recent time period such devices have been used for generating hydrogen plasmas. The main parameter of all such experimental devices that is important for the method described herein is the magnetic field strength.

The homopolar devices have a relatively strong magnetic field that is in the range of 0.04-0.4 T.

As alternatives to the homopolar devices using strong magnetic field also systems having weaker magnetic fields have been investigated, see V. N. Bocharov, S. G. Konstantinov, A. M. Kudriavtsev, O. K. Myskin, V. M. Panasiuk, A. F. Sorokin, F. A. Tselnik, "Equilibrium state of the rotating plasma in a mirror trap", Fizika Plazmy, Vol. 4, May-Jun. 1978, pp. 488-491 (in Russian), and S. G. Konstantinov, F. A. Tselnik, "Measurement of the electric field of the rotating plasma", Fizika Plazmy, Vol. 1, Sep.-Oct. 1975, pp. 802-805 (in Russian).

The main characteristics for the generation of plasmas in these devices are the discharge voltage used and the obtained plasma density which are different by approximately one decade (in the magnitude of order 10:1).

The same difference is known for magnetron technology. In the current scientific and industrial publications magnetron cathodes having week and strong magnetic fields are described, see the above cited book by J. Reece Roth and D. V. Mozgrin, I. K. Fetisov, G. V. Khodachenko, "High-current low-pressure quasi-stationary discharge in a magnetic field: experimental research", Plasma Physics Reports 21 (5) (1995), pp. 400-409, and also the Russian patent documents RU2058429 and RU2029411.

Week magnetic fields can for this technology conventionally be set to be within the range of 5-50 mT and strong magnetic fields within the range of 0.1-0.2 T.

Magnetrons also demonstrate the existence of two different regimes that have different discharge voltages. For a week magnetic field the magnetic field strength is 30-50 mT, and the strong magnetic field is 0.1-0.2 T. The discharge voltage is 300-1000 V and below 50-70 V, respectively. The difference in discharge voltage has been explained by the strong interaction of a plasma rotating around the system axis and viscously fractioning with end insulators. For magnetrons it means interaction with the cathode material, see the review by Lehnert cited above.

High voltage discharges are traditionally used for magnetron cathode sputtering. Low voltage discharges are used for ionization of gas. Neither high voltage nor low voltage pulsed, high current discharges have been used up to now for decomposition of complex molecules.

It has been found that when using high current pulsed discharges in crossed electric and magnetic fields for decomposition of complex molecules such as $C_2H_2$ and in an accompanying deposition of radicals the following four phenomena have to be considered:

1. The resulting materials after conventional deposition and/or reactive deposition of radicals onto work pieces and other objects, such as on the walls of the process chamber or chambers, have in most cases a relatively high electrical resistivity or are completely dielectric. In particular, areas of the electrode surfaces can be coated with such materials which will interfere with or obstruct the discharges. Therefore, in order to use a high discharge current a specific design of the process chamber and of the discharge electrodes may be required to avoid such interfering coatings.
2. It was found that when using high current discharges for ionizing operating gases comprising complex molecules like $SiH_4$, $CH_4$, $C_2H_2$, there is an increased tendency that the desired diffused glow discharges will proceed into or be transformed into arc discharges. This tendency is particularly important or noticeable for such discharges in those cases where the cathode is made from graphite due to the natural porosity of such cathode material.
3. The maximum amplitude of the discharge current is limited by the gas dynamic in the process chamber used for the decomposition. In order to decompose molecules of an operating gas the gas is introduced into a decomposing cell, into the plasma beam generated in the cell. The molecules of the operating gas arrive into the plasma region with a thermal speed that is about $10^2$-$10^3$ m/s. If there is a too high collision frequency between electrons and molecules of different kinds in the plasma, all molecules can be decomposed and solid radicals can then be deposited onto the work piece surface, before new molecules will come into the plasma region. This may happen e.g. if the molecules of the operating gas contain atoms that themselves form solid materials. Hence, in the latter case the energy of the discharges will be mainly used for only heating volatile atoms and simple molecules like hydrogen. It results in the conclusion that for optimization of the decomposition process it may be necessary to have relatively long pulses, each of a moderate power. It was found that optimal pulse lengths may be in the range of about 1 ms-10 s. The discharge current space density may then e.g. be in the range of about 0.1-10 A/cm².

4. It was found that the efficiency of the decomposition process strongly depends on the magnitude of the discharge current. Consider the case of rectangular shaped current pulses, the magnitude of which is varied from pulse to pulse. If the amplitude of such a current pulse is low, the plasma density and electron energy will be low too. It results in a decomposition process having a low efficiency and at the same time overheating and erosion of the electrodes, energy and gas losses. Also, it implies that if a current pulse is for example sinus-shaped, the decomposition process is low at the initial and final discharge stages of the pulse. These stages may be said to be lost for decomposition and only stages near the peak current are suitable therefor. It means that sinus-shaped and current pulses having a shape such as a triangle, an exponential function and the like are not suited for the decomposition and may have a low interest in practical use. Such current pulses may have disadvantages such as energy losses, heating of the discharge electrodes, erosion of the discharge electrodes mentioned above, and other negative phenomena. A choice that can give a better result may be to run the discharges by rectangular shaped current pulses having a suitably selected, sufficiently large magnitude. It was found that for discharges generated for decomposing molecules of an operating gas, the discharge voltage is fairly constant for any discharge current amplitude. It means that the optimal discharge power has to be substantially constant during the whole discharge time.

Figure 1B:
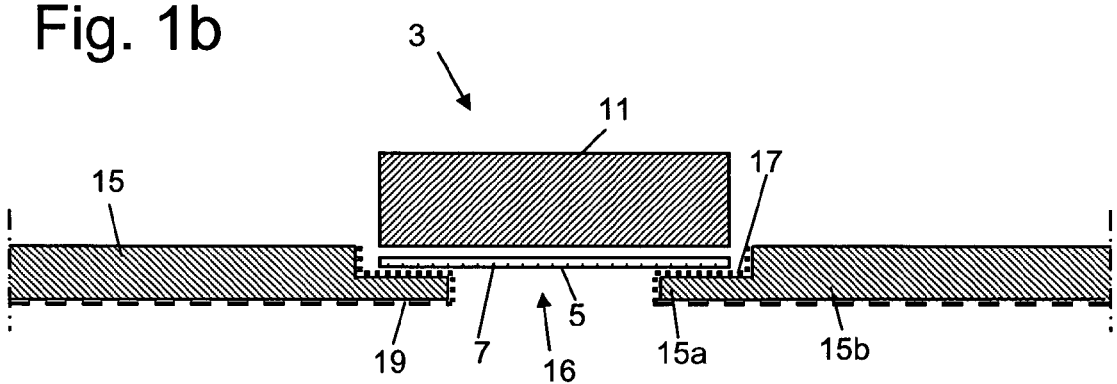
FIG. 1b is similar to FIG. 1 for a plasma decomposition cell that is externally mounted.

FIGS. 1a and 1b are schematics of two embodiments of plasma decomposition cells (PDCs) 1, 3 for producing a plasma at the free surface 5 of a cathode 7. FIG. 2a is a schematic plan view of a process chamber 9 including three PCDs 1 with permanent magnets 11 mounted inside the process chamber and one PCD 3 with the permanent magnet located externally. FIG. 2b is a schematic of a divergent plasma beam 13 generated at and emitted and expanding from a region at or some small distance of the surface 5 of a cathode 7. The arrow indicates the expansion direction. If two opposite plasma sources are operated the generated plasma occupies the space between the respective cathodes as schematically shown in FIG. 3. The direction of the decomposing plasma beam is perpendicular to the free surface 5 of the cathode. A characteristic length of the plasma beam may be in the range of 5-20 cm.

Thus, in the PCD of FIG. 1a all main components thereof are located inside the process chamber 9, compare FIG. 2a. In this case the walls 15 of the process chamber may be electrically conducting and electrically connected to the anode potential. In the embodiment of FIG. 1b an opening 16 is made in the walls of the process chamber, the permanent magnet 11 is mounted outside the process chamber and the cathode 7 is arranged in the opening. The cathode is electrically insulated from the walls 15 of the process chamber and at least a portion of the free surface 5 of the cathode is a part of the surfaces delimiting the process chamber. The anode has a main part 15a which has at least some portions thereof located in front of the free surface of the cathode, as seen when looking at the free surface of the cathode 7, i.e. closer to the center of the process chamber. The main part of the anode can be configured as flanges extending from the interior surfaces of the walls 15 of the process chamber 9 as in FIG. 1a. Such flanges can have a first portion extending perpendicularly to the inner surface of the walls 15 of the process chamber and an end portion extending in parallel to said inner surface and hence also parallel to the free surface 5 of the cathode, the end portion possibly extending also somewhat over the free cathode surface, i.e. in particular the cathode surface that e.g. can substantially flat and is directed to or facing the interior or the center of the process chamber 9. Generally, the cathode can have the shape of a plate having two opposite large surfaces and edge surfaces. Then one of the large surfaces faces the interior or the center of the process chamber. Also, the main part 15a of the anode can be configured as the surfaces of the electrically conductive process chamber walls which are located at or in the vicinity of the cathode 7 and in particular as an electrically conducting layer or sheet on said wall surfaces of the process chamber surrounding the cathode free surface 5 as shown in FIG. 1b. In this case the opening 16 can be made to include a rear step so that the wall surfaces of the opening includes a first portion extending perpendicularly to the inner surface of the walls 15 of the process chamber 9 and a second portion extending in parallel to said inner surface and hence also parallel to the free surface 5 of the cathode, the second portion located closer to the interior of the process chamber and possibly extending also somewhat over the free cathode surface, in the same way as in the case of FIG. 1a. The anode also includes an anode extension 15b that can be parts of the process chamber walls 15 located around the cathode 7 in the case where said walls are electrically conducting and in another case it can include electrically conducting sheets or layers on said parts. A water cooling line 4 extends to the permanent magnet 11 for cooling it and a power line 5 connects the cathode 7 to a power supply or pulse generator, not shown.

The process chamber 9 can be circular or have a polygon shape such as being square or rectangular as seen from above. It can include one or more decomposition cells 1, 3, e.g. four cells as in FIG. 2a.

In the deposition process when a PCD such as one of those 1, 3 described above is operated all surfaces in the process chamber 9 and of all objects located inside the process chamber are covered with a layer of deposited material. This may require that time after time the deposited layers are removed mechanically from at least the anode parts 15a, 15b. Otherwise, such layers may crack and delaminate which can result in a transformation of the desired glow discharges into arc discharges.

In particular, it was found that in the deposition process the material deposited on different portions of the main anode part 15a may obtain different electric properties. In particular, those surfaces 17 of the main anode part 15a which are direct towards or face the cathode 7 obtain coatings of deposited material that has electric properties different from those of the material deposited on surfaces 19 of the main anode part that are not direct towards or does not face the cathode. For example, for materials and the CVD processes described in the published International patent application WO 2008/105736, including and using elements such as C, H, N, O, the surfaces 17 facing the cathode 7 are covered with an electrically conductive layer, but the other surfaces of the main anode part 15a are covered with a dielectric layer. The first mentioned surfaces 17 can be said to be shielded from the main portion of the generated plasma so that no direct deposition of substances therefrom can be made.

Using the CVD processes described in the cited International patent application WO 2008/105736, wherein the cathode 7 is a plate made from graphite, high current pulsed discharges can be obtained between the inner surface parts 17 of the main anode part 15a and the cathode 7. In the embodiment of a process chamber 9 illustrated in FIG. 3 dielectric coatings are also deposited on the holder 21 holding the work piece 23 in the centre of the process chamber 9. The work piece holder extends from a work piece load lock 25 that is electrically connected to the anode parts 15a, 15b. The work piece 23 can have an electric potential different from ground and/or the anode potential, i.e. be electrically DC biased.

In the embodiment of a rectangular process chamber 9 in FIG. 3 two interior PCDs 1 are used that are located opposite each other and have the workpiece 23 placed therebetween. The air trap door 25 is located in one wall connecting those walls where the two PCDs are mounted. In front of the fourth wall, i.e. the other wall that connects the two opposite walls of the process chamber 9, a radical filter or radical trap 27 is mounted. The trap divides the process chamber 9 in a work space 29 where the workpiece 23 and the PCDs are located and a rear, shielded space 31. The trap is configured to prevent the direct flight of the any species, i.e. atoms, molecules, ions and radicals and aggregates thereof from the work space to the shielded space.

The trap 27 can be any kind of labyrinth that does not permit the direct flight of the solids atoms and radicals from one to another side of the trap. For example it can be a set of the plates, not shown, having randomly drilled holes having non-coinciding positions on the plates. The number of the plates and number of the holes and their diameter may suitably be chosen experimentally during process optimisation. The optimisation parameters include the operating gas residence time in the process chamber 9 and the efficiency of the solids condensation on the trap plates. The gas residing time is higher if the gas conductivity of the trap 27 is lower. Also, the solids condensation efficiency is higher if the conductivity of trap is lower. But if the gas conductivity is too low, the deposition rate will be low too.

The filter/trap 27 prevents the interior wall surfaces of the shielded space 31 from being coated with a dielectric layer. Furthermore, it protects the working surfaces of a turbo-pump 10 from being coated with the not desirable materials. As well it prevents penetration of the hazardous species and radicals into a roughing pump 11. The hazardous radicals can destroy the oil in the pumps 10 and 11.

In this embodiment, if the inner wall surfaces of the shielded space 31 are connected to the anode, high current, pulsed discharges can be ignited between these surfaces and the cathodes of the PCDs 1. The anode part 15d is used as the conductive anode. It was found that the discharge current flows from the cathode surface 5 to the anode surface 15d through the filter plates 27 for relatively long distances.

The operating pressure of the CVD method is in the range of $10^4$-$10^1$ Torr, preferably in the range of $10^{-2}$-$10^1$ Torr.

According to Pashen's law the discharges will preferably occur between places on the electrodes that are located at the highest distance of each other.

There is another method of igniting the high current pulsed discharge in the process and for the materials that are described in the cited International patent application WO 2008/105736. The main goal of the process and material according to said patent application is the deposition of vibration damping materials onto work pieces of various kinds. It was found that the deposited material is electrically conducting if the cathode is made from a metal. It was found that in this case the deposited layers, in addition to having a sufficient electrical conductivity, still have good mechanically damping properties.

The phenomena and problems described in the point 2.-4. are of high importance for an efficient industrial application of high power, low duty cycle PA CVD. Briefly the main issues include the time profile of the electrical current pulses applied, the design of the electrodes and the problem of arc suppression.

In the published International patent application WO 2006/049566 cited above a method of producing high current pulsed discharges is disclosed. The method is based on adding half period sinusoidal signals. The method is applicable to discharges produced using electrical circuits where the electrical impedance of the power supply is much higher than the impedance of the discharge gap. However, the impedance of the discharge gap is almost equal to zero. The method is used for very high power magnetron sputtering. The PA CVD methods described herein instead must use a limited discharge currents in the pulses. The limiting factor is the dynamics of the operating gas molecules in the process chamber 9. Therefore, for such methods the impedance of the electrode gap in the decomposing cell is of a magnitude comparable to that of the power supply or is even higher. The (maximum) amplitude of the total resulting composite pulse according to this International patent application is equal to the (maximum) amplitude of each element sinusoidal signal from which the composite pulse is formed. Tozer and Lehnert, see the above cited articles, showed that the impedance of a discharge gap in crossed electric and magnetic fields is a complex quantity and can be represented as a parallel and serial combination of a resistance, a capacitance and an inductance. It means that the current of the element, added pulses cannot strictly have a sinusoidal shape, but instead the current can be said to be sinusoid-like. This is different from the conditions described in the cited International patent application WO 2006/049566. Therefore, the method and apparatus disclosed in this cited International patent application are applicable only to the narrow area of the technology now called HIPIMS, see the Internet home page at http://en.wikipedia.org/wiki/High_Power_Impulse_Magnetron_Sputtering.

In the paper by Mozgrin et al. cited above, a method of producing rectangular shaped current pulses is described. The method is based on an open-circuit line and allows that rectangular shaped current pulses are produced using one single large energy accumulator, i.e. a single capacitor. The energy that has to be accumulated for producing each current pulse is 5.5 kJ. A planar circular cathode having a diameter of 120 mm was used. It is obvious that for larger systems the accumulated energy must be much higher. The problem is that in such systems glow discharges will be transformed into arc discharges and thus all accumulated energy will be dissipated in one small area of the work piece. It results as a minimum in destruction of a deposited layer, and as a maximum in a destruction of the whole system. Therefore the problem of producing pulses and arc suppression is of very large interest, especially for large industrial machines.

Figure 4:
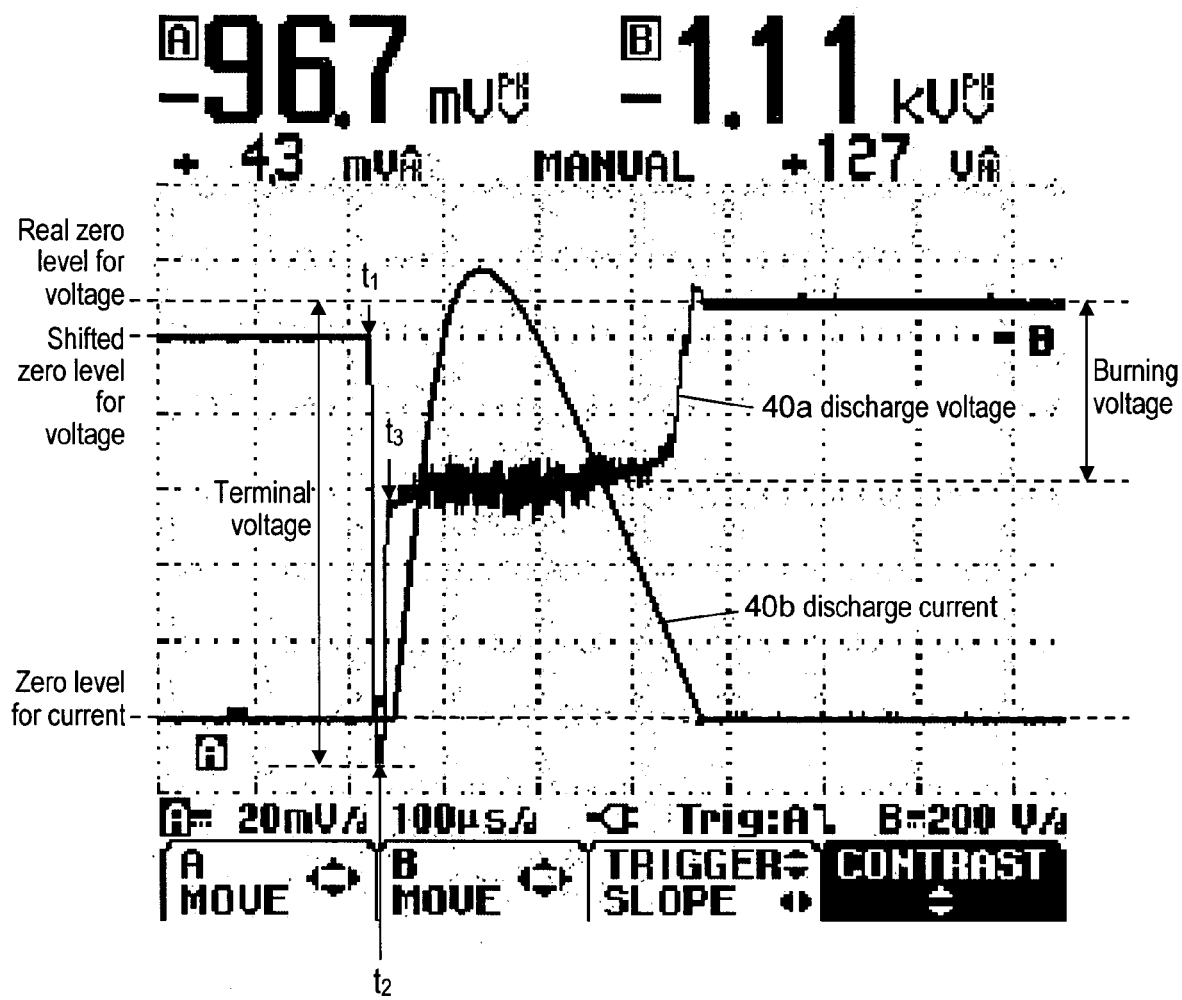
FIG. 4 is a diagram of traces of the voltage and current for an electrical discharge between electrodes in the plasma decomposition cells of FIGS. 1 and 1b.

The method that will now be described is based on adding low power sharp-peak shaped current pulses sequentially in time. In the diagram of FIG. 4 traces recorded for a short current pulse are shown when applied to an electrode gap of a decomposition cell in preliminary set-ups. The operating gas for the decomposition cell was acetylene $C_2H_2$. The graph 40*a* is the voltage trace and the graph 40*b* is the electrical current trace for the discharge. The measured values are shown in arbitrary units. The discharge current was recorded at the positive input of the oscilloscope used and is therefore located above the zero level at A. The signal cable for the voltage was connected to the negative/reversed input of the oscilloscope and is located below another, respective zero level at B. The zero levels at the latter input before and after the pulsed discharge are different. It is caused by the parasitic capacitance of the voltage probe and the measuring scheme. The real zero level is that which is shown after the discharge. The current measuring probe rate was 1 A:1 mV. Therefore the discharge current amplitude measured was about 100 A. The voltage probe rate was 1:1. Therefore the terminal voltage was measured as about 1.1 kV and the discharge voltage was measured to be about 500 V. At the time $t_1$ the power supply was connected to the discharge gap by a solid state switch. Therefore the voltage at the discharge gap increased from zero to the terminal voltage of the power supply that is about 1.1 kV. The period from $t_1$ to $t_2$ (about 10-20 μs) is the time for the development of the discharge gap electrical break down. In other words it is the time of the glow discharge development. After break down the voltage at the discharge gap drops down from the terminal voltage of 1.1 kV to the "burning" voltage that is about 500 V. At the time $t_3$ the discharge current starts to grow after gap break down. The complex and significantly different shapes of the discharge voltage and current traces are caused by complex processes in the plasma that is located in the crossed electric and magnetic fields of the plasma source with closed electrons drift. As can be seen the discharge voltage is substantially constant for all current values during the discharge time. As can be see in FIG. 4, during the discharge, the current amplitude, see trace 40*b*, rises from zero up to a maximum and thereafter decreases to zero. At the same time the voltage, see trace 40*a*, is almost constant, only having relatively small ripple, for all current values during the discharge. It means that the voltage does not depend on the electrical current values. In other words it means that the impedance of the discharge gap decreases when the discharge current increases. It was found that adding more electrical current to that used in the test by summing currents from individual sources in the joint load will not result in any disturbance of the operation of the discharge circuits. The tests were done for values of the electrical current of up to 1 kA. This statement is valid only for glow discharge devices, called devices with closed electron drift. Initially, such devices were called homopolar and homopolar-like devices, see the article by K. Halback et al. cited above. To the homopolar-like plasma sources relates in particular sources called magnetron plasma sources. The specific of the application of these sources in the method described herein is that cathode sputtering is a negative phenomenon, compare the positive use of sputtering in e.g. magnetron sputtering devices. The cathode erosion caused by sputtering results in a necessity of frequently exchanging the cathode plate which increases the production costs. To reduce the cathode erosion a stronger discharge enhancing magnetic field can be used, see the article by Mozgrin et al. cited above. A strong magnetic field results in a significant reduction of the discharge voltage and by this way a strong decrease of the cathode sputtering/erosion. It means that the impedance of the discharge gap of the devices having closed electron drift is complex as described in the articles by Lehnert and Tozer cited above.

It is necessary to emphasize that for a simple resistive load summing of individual electrical currents in the load results in a corresponding increase of the voltage drop over the load. In that case, not considered herein, the method of building pulses by summing element pulses does not work.

Figure 11A:
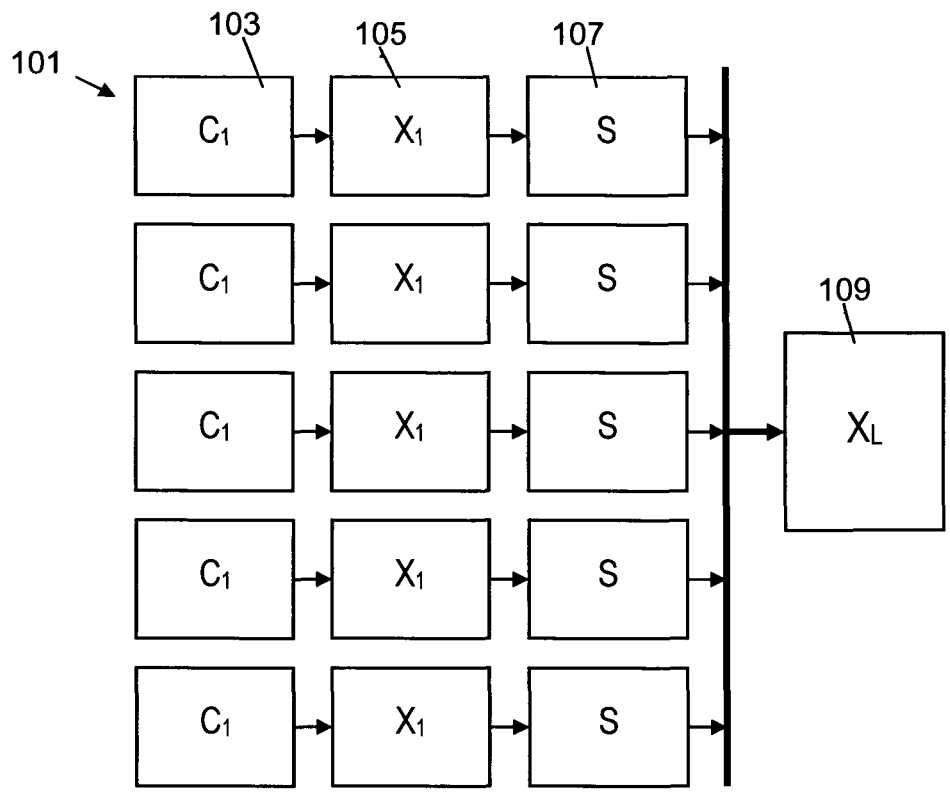
FIGS. 11a and 11b are schematic block diagrams illustrating the principle of electrical interconnection of power supply units for generating element pulses.

The feasibility of the method of summing individual electrical currents was proved for both high and low strengths of the discharge enhancing magnetic field by designing the current supply scheme as a plurality of element power supply circuits 101 operating in parallel with each other, see the schematic circuit diagram of FIG. 11*a*. In each such element circuit a capacitor 103 having the capacitance $C_1$ is connected in series with the impedance $X_1$ of the respective element circuit, represented by the item 105, and a switch 107. The element circuit 101 is connected to the load, illustrated as the box 109, having the impedance $X_L$. The load impedance $X_L$ has a complex nature and is in detail described by Tozer and Lehnert in the papers cited above. The impedance $X_L$ varies in the different stages of the discharges, which can result in a complex variation of the discharge current as a function of time, see FIG. 5*b*. The impedance $X_1$ of the element circuits 101 is constant and can be measured by short connecting the load 109. The impedance $X_1$ of the element circuits depends on parameters of the respective circuit and can have a mainly resistive, capacitive or inductive character. For the application described herein a circuit impedance having an inductive character may be the most suitable one. In this case the impedances $X_1$ can be written as $L_1$. An inductive impedance results in a lower dissipation of the energy accumulated in the capacitor 103 in the element circuits 101. It can result in the highest possible transformation of the accumulated energy to the operating gas decomposition process.

Typical values of the capacitances $C_1$ and the inner inductances $L_1$ are in the ranges of 1 nF-10 μF and 1 nH-10 μH, respectively.

In operation, the capacitor $C_1$ may thus be discharged through an inductance 105, $L_1$ and the impedance $X_L$ of the gap of the decomposition cell, the latter being the load. In the tests, the capacitors of the parallel element circuits 101 were charged to the same voltage and then simultaneously discharged or they were discharged with the discharges starting successively with some, relatively small delay one after another. In the test five parallel circuits were connected to the load 109. As expected, the impedance $X_L$ of the electrode gap of the decomposition cell was complex and variable during the discharge period and hence the discharge current varied in time, see graph B in FIG. 4. The impedance varied from infinity down to 100 Ohm.

Figure 11B:
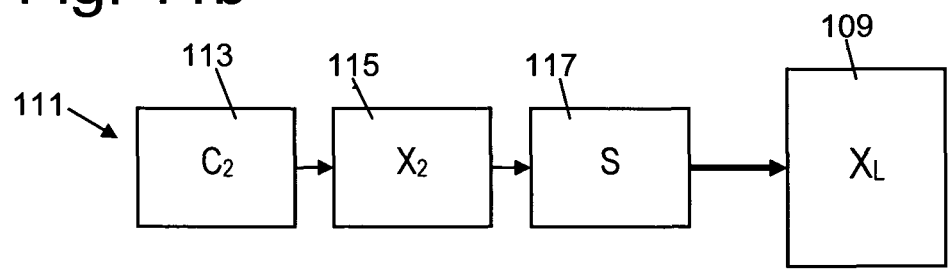

In another preliminary set-up, see FIG. 11*b*, the discharges were performed for the same load 109, $X_L$ and a single circuit 111 of the same kind but having a capacitor 113 having a capacitance $C_2$ equal to five times the capacitance $C_1$ of the capacitors 103 in the circuits 101 of FIG. 11*a* and an inner impedance illustrated as the inductor 115 having an inductance value $L_2$ equal to one fifth of the inductance $L_1$ of the inductors 105. The single capacitor was charged to the same voltage as the five capacitors had been charged in the first set-up illustrated in FIG. 11*a*. This second experiment thus simulated the parallel operation of the five parallel circuits 101. It was found that in both cases the voltage over and the current pulses in the load 109 where the same as those shown in the diagram of FIG. 4. Generally, it was also found that the parallel circuits 101 did not influence each other even if their parameters are different, such as the capacitance and inductance values $C_1$, $L_1$, and when the times of starting the respective discharges are shifted in time.

Obtained results clearly demonstrate that a large integral or composite discharge current pulse can be produced as a sum of pulses that are generated by independently operating, parallel circuits and added to each other.

This kind of the operation can be schematically presented as a current pulse matrix operation where the axes are the amplitude (columns) and the time (rows). This principle was chosen for computer simulation of square or rectangular shaped current pulses that actually were a sum of individual pulses.

Figure 5A:
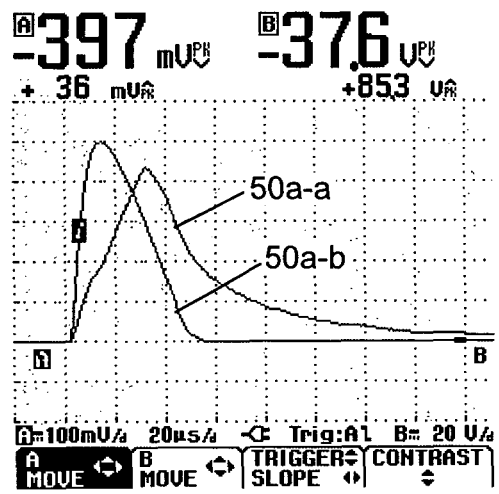
FIG. 5a is a diagram of characteristic shapes of current pulses between electrodes in the plasma decomposition cells of FIGS. 1 and 1b for different impedances of the cell.
Figure 5B:
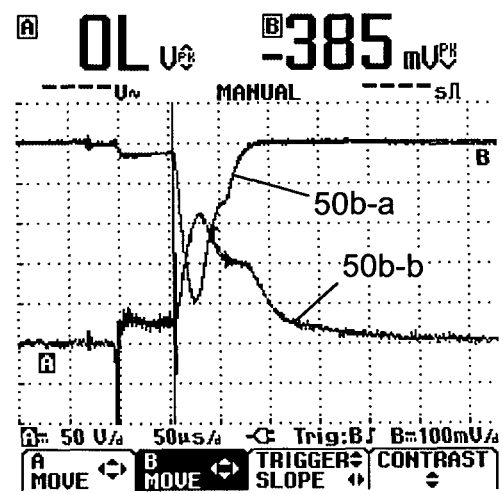
FIG. 5b is a diagram of the voltage and current pulses in relation to a work piece for the plasma decomposition cell of FIGS. 1 and 1b, FIGS. 6a, 6b and 6c are diagrams of different shapes of current pulses used as examples for computer simulation including a triangle shape, a shape having an exponential decay and a complex "broken" shape, respectively.

Experimentally it was found that typical shapes of suitable current pulses include primarily sharp peak shaped pulses. Typical pulse shapes are shown in FIGS. 5a and 5b. The current traces 50a-a and 50a-b in the diagram of FIG. 5a correspond to different discharge current (maximum) amplitudes. The traces 50b-a and 50b-b in FIG. 5b are, respectively, the traces of the current between the electrodes in the decomposition unit and the current towards the electrically biased work piece. The pulse shape 50a-b is called a "broken triangle" pulse and is generated at a higher operating pressure than used for obtaining the graph 50a-a and for a magnetic field strength comparable to that used for obtaining the graph 50a-a.

The work piece biasing can be arranged in any conventional suitable way. The particular fact to be considered is that the biasing current is strongly limited by the resistance of the deposited layer. The biasing can be done by a separate power supply, not shown.

Hence, to investigate the matrix-approach operation a computer simulation was performed. Triangle, exponential, and broken triangle shaped pulses, see FIGS. 6a, 6b and 6c, respectively, all having sharp peaks, where chosen for demonstrating the possibility of producing rectangular shaped pulses by adding element pulses. The principle of producing composite pulses of a desired shape is illustrated by the diagrams of FIGS. 7a-7e. The difference between FIGS. 7a-7e is the delay time between the successive, added pulses. The element pulse is a pulse having an exponentially decaying shape. It can be seen that when decreasing the delay time the intended rectangular pulse starts to be recognizable.

Figure 8A:
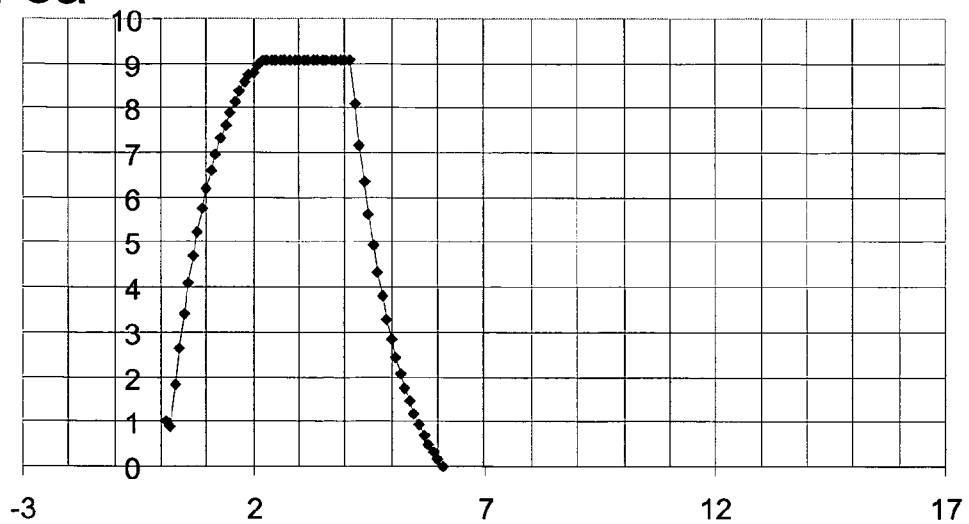
FIGS. 8a-8c are diagrams of resulting composite current pulses formed from element pulses having different delays between them according to a computer simulation.
Figure 8B:
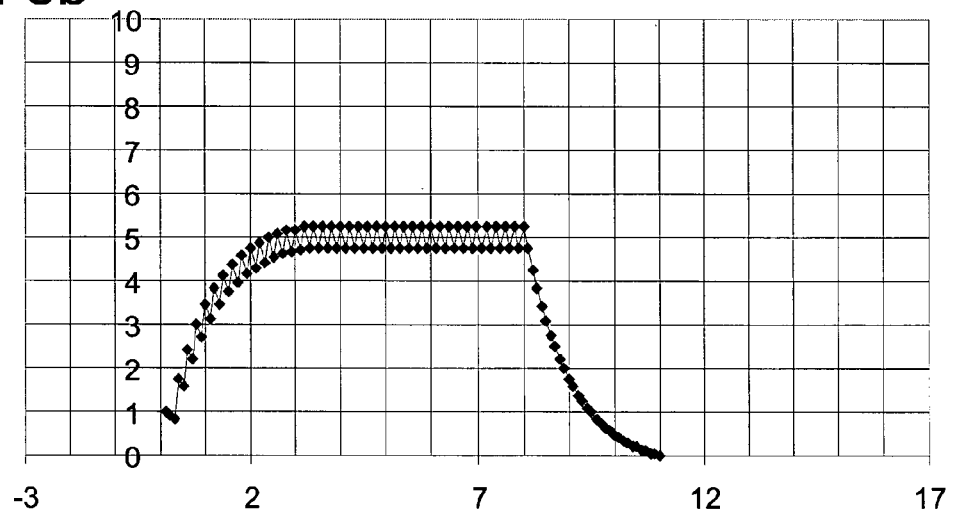
Figure 8C:
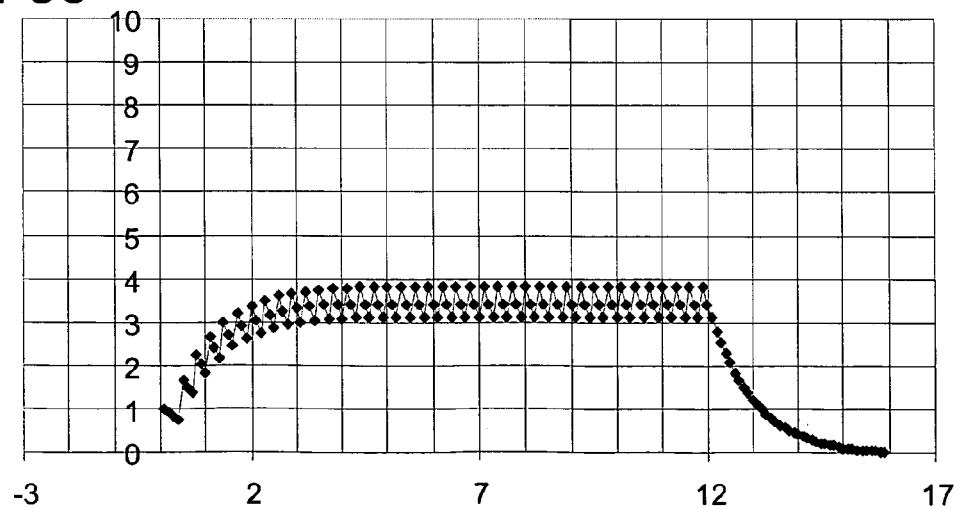
Figure 8D:
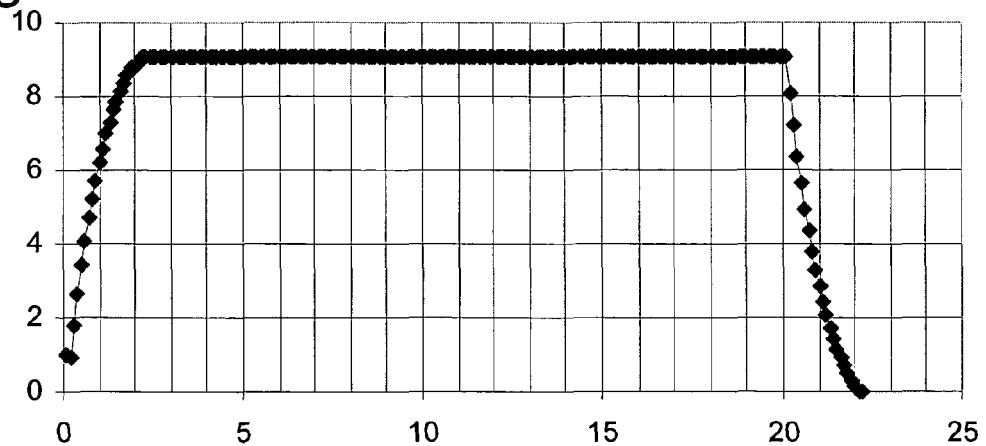
FIG. 8d is a diagram of a resulting composite pulse formed by summing exponentially-like element pulses according to a computer simulation.

In FIGS. 8a-8c relatively well shaped, rectangular pulses are shown. The ripple depends on the time delay between the element pulses used to generate the illustrated rectangular pulses. The ripple given in percent can be reduced almost to zero by decreasing the delay time between the element pulses. It can also be seen that by decreasing the delay time (or equivalently the percent ripple) the (maximum) amplitude of the resulting rectangular pulse is increased. The (maximum) amplitude of the element pulses was chosen to be equal to 1 in the diagrams. As can be seen in FIG. 8a, the amplitude of the resulting pulse is equal to 9, and the percent ripple is a few percent for the delay time used for deriving the resulting rectangular shown in this diagram. A low percent ripple is not critical for the practice because of the high frequency waves and instabilities in the plasma that are always generated by the high current total pulse (see FIGS. 4 and 5b). The smooth traces of the pulses shown in FIG. 5a are obtained by filtering away the high oscillations that are actually detected by the current probe used for measuring. The graph of FIG. 8d is different from FIG. 8a only by the number of summed pulses. The parameters used in constructing the diagrams of FIGS. 8a-d and resulting characteristics are as follows.

TABLE 1

| FIG. | Delay time Δ between element pulses | Number N of element pulses summed | Amplitude AΣ Length t of resulting composite pulse | | Ripple δ |
|---|---|---|---|---|---|
| 8a | 0.01 τ | 40 | 9 A | 5 τ | ~3% |
| 8b | 0.2 τ | 40 | 6 A | 8 τ | ~20% |
| 8c | 0.3 τ | 40 | 3.5 A | 12 τ | ~25% |
| 8d | 0.01-0.005 τ | 200 | 9 A | 40 τ | | where Δ is the delay time between the summed element pulses, N is the total number of summed element pulses, AΣ is the average maximum amplitude of the resulting summed pulse, A is the maximum amplitude of each element pulse, t is the length of the resulting summed pulse, τ is the characteristic time of the exponent decay of the element pulses, and δ is the ripple given in percent of the amplitude of the element pulses.

Figure 8E:
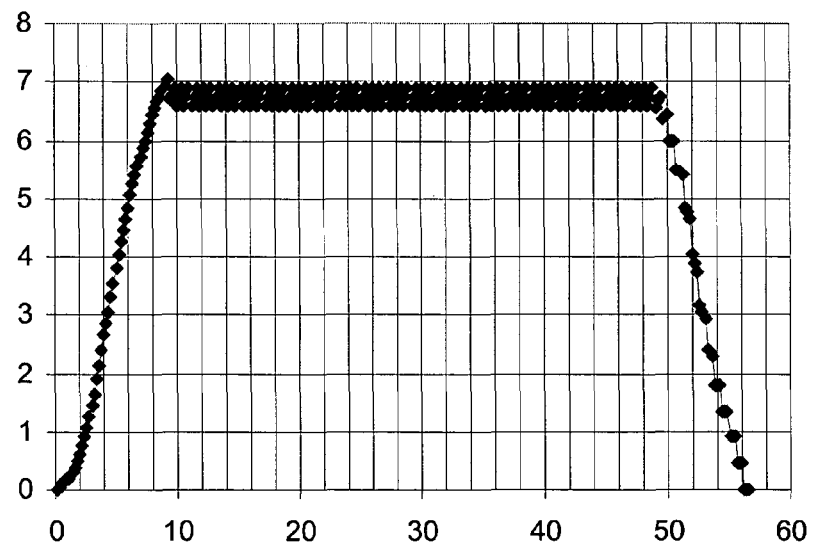
FIG. 8e is a diagram similar to FIG. 8d but for element pulses having a "broken" shape according to a computer simulation.

In FIG. 8e the shape of a summed composite pulse is illustrated that is formed by adding broken triangle identity pulses, of the kind shown in FIG. 6d.

Figure 6A:
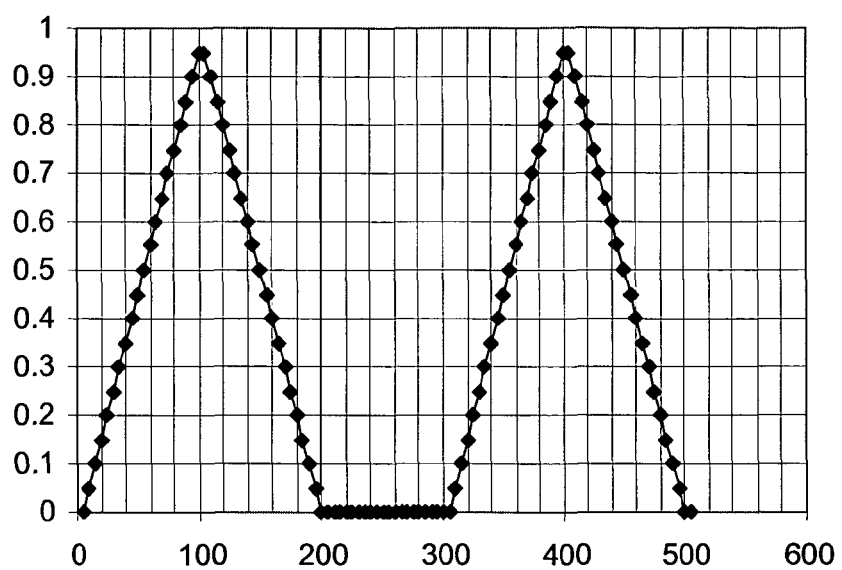
Figure 6B:
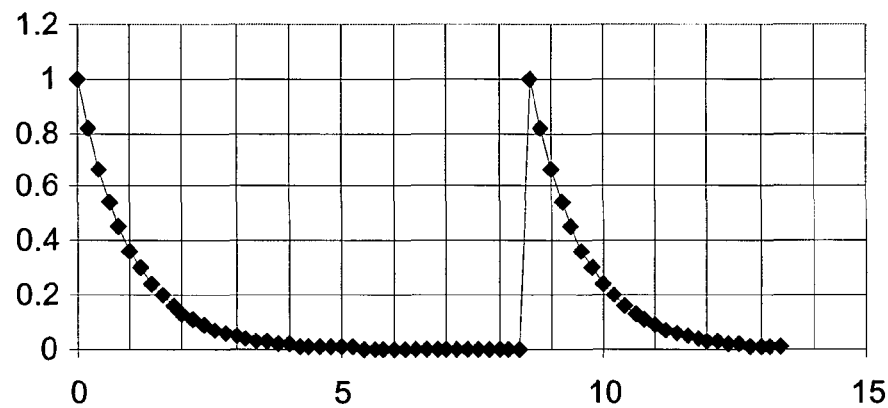
Figure 6C:
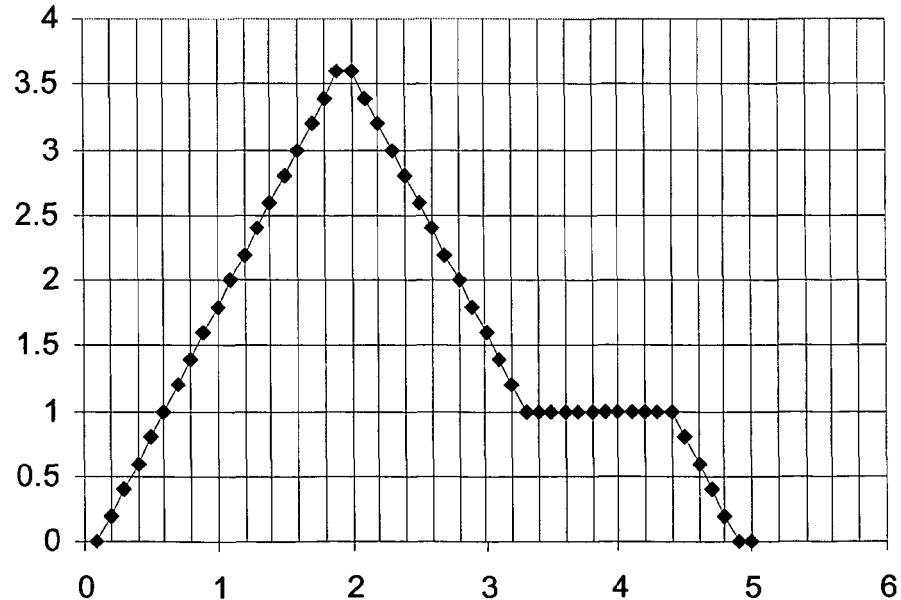
Figure 7A:
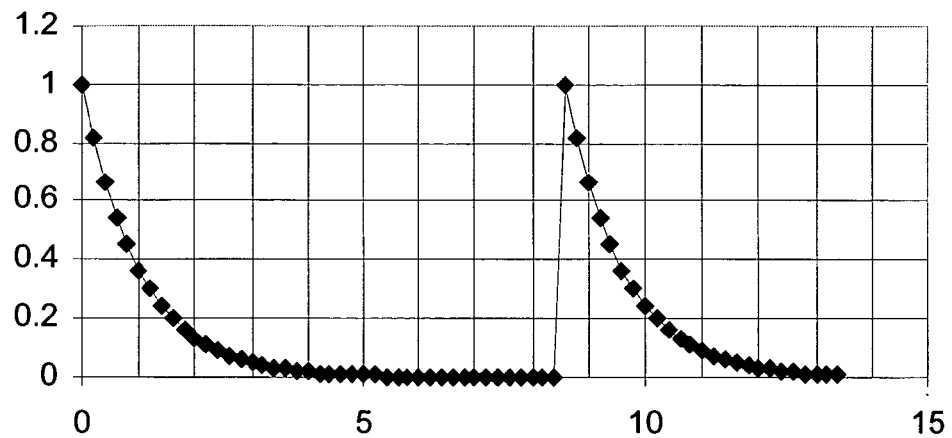
FIGS. 7a, 7b, 7c, 7d and 7e are diagrams of illustrating different steps in a computer simulation of a current pulse forming principle including summing small element pulses having an exponential decay.
Figure 7B:
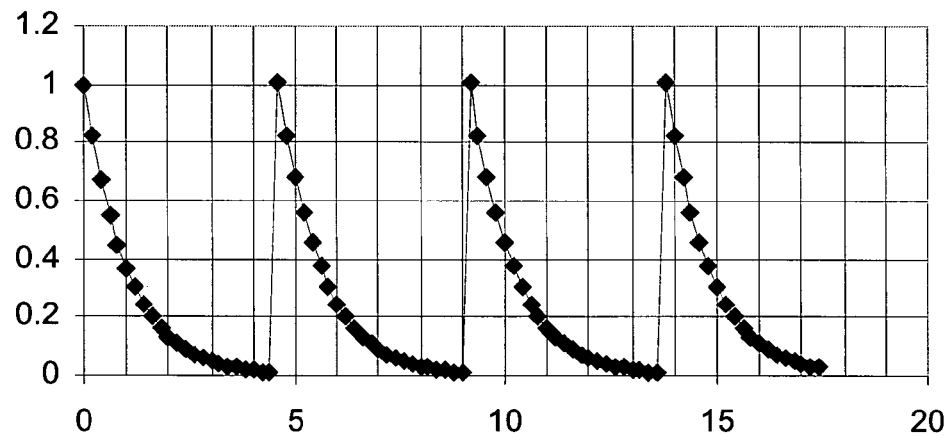
Figure 7C:
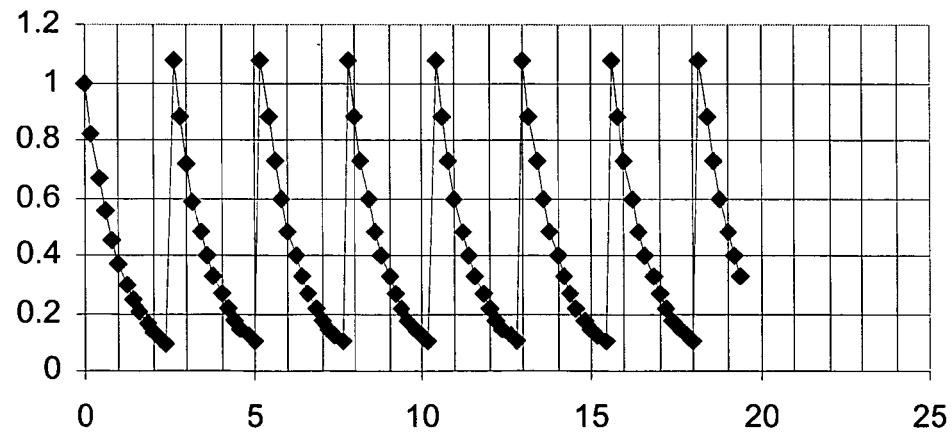
Figure 7D:
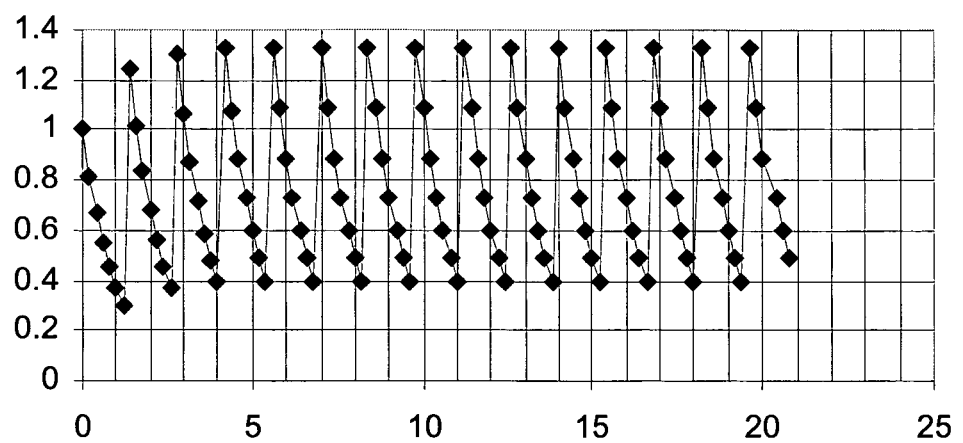
Figure 7E:
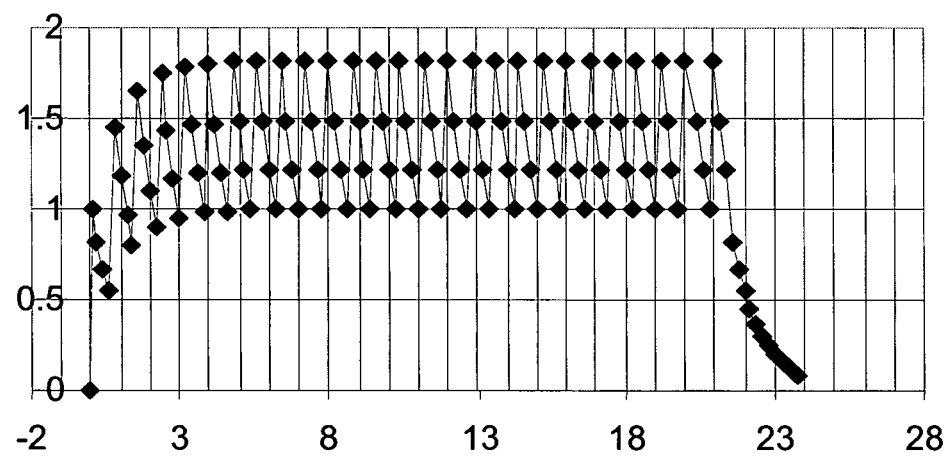
Figure 8F:
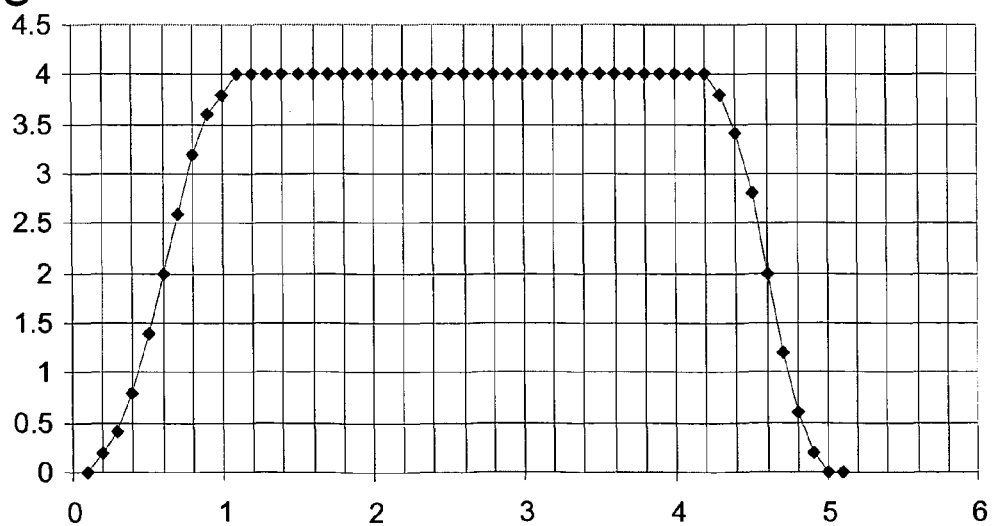
FIG. 8f is a diagram similar to FIG. 8d but for element pulses having a triangular shape according to a computer simulation.

In FIG. 8f the shape of a summed composite pulse is illustrated that is formed by adding triangle identity pulses, of the kind shown in FIG. 6a.

As can see been the rising and decay times of the resulting rectangular-shaped pulses decrease relative to the total pulse time t when increasing the number N of added element pulses.

Generally, by a performed computer simulation analysis it was shown that a rectangular pulse can by obtained by summing element pulses of almost any kind as long as they have sharp peaks. "Sharp peaks" can herein be taken to mean that the element pulse should have a triangular shape in the peak region, i.e. they should not have a region at their peaks that is substantially flat or where they are substantially constant. Alternatively, the element current pulses having sharp peaks can be taken as current pulses being short in relation to the formed composite current pulse, e.g. shorter than one fifth or one tenth of the length of the composite pulse formed, the element pulses following one after another with so short time intervals, that after the peak of a first pulse, the first pulse will not reach a low level until the next pulse is started. The low level can here suitably be taken as higher than e.g. one quarter of the pulse height or better half the pulse height or even higher. The element pulse thus can have a rise time up to the peak of a length between e.g. of one tenth of the length of the formed composite pulse and substantially zero, as seen in FIGS. 6a-8f, and a decay time of a length shorter than one fifth or one tenth of the length of the composite pulse. In practice a desired amplitude ripple can be achieved by adjusting the delay time between the start of the element pulses.

The next problem encountered in high current PA CVD is the problem of arc suppression. As already described above, arc formation is a particularly important problem in reactive processes based on gases containing carbon and for discharges to a cathode made from graphite.

The matrix method of producing desired rectangular pulses allows that all further pulses after an arc has happened are stopped which can be made relatively fast due to the short element pulses. It significantly lowers the problem compared to method described in the cited paper by Mozgrin. But still such a fast stopping of the supplying of element pulses is in many cases not enough to achieve a sufficiently efficient suppression of arcs. It is because of the observed fact that the arc very rarely follows as one single event. Usually, it is long tale of arcs following one after another. In that case the mentioned method of stopping the discharges will as a maximum have an efficiency of 50%. It is so because each time when the next arc in the succession is detected, a new element pulse has already been started to be generated. In particular, the transition time from glow discharge to arc discharge is so short that if an arc has happened a controller obviously can only react after the occurrence and detection thereof. Using this method, the damage done by arcing can be somewhat reduced. It further means that it could be favourable if the mentioned method of arc suppression could be supplemented with a method allowing recognizing an arc before the arc will actually happen, by e.g. detecting some precursor, if any or possible.

Figure 9A:
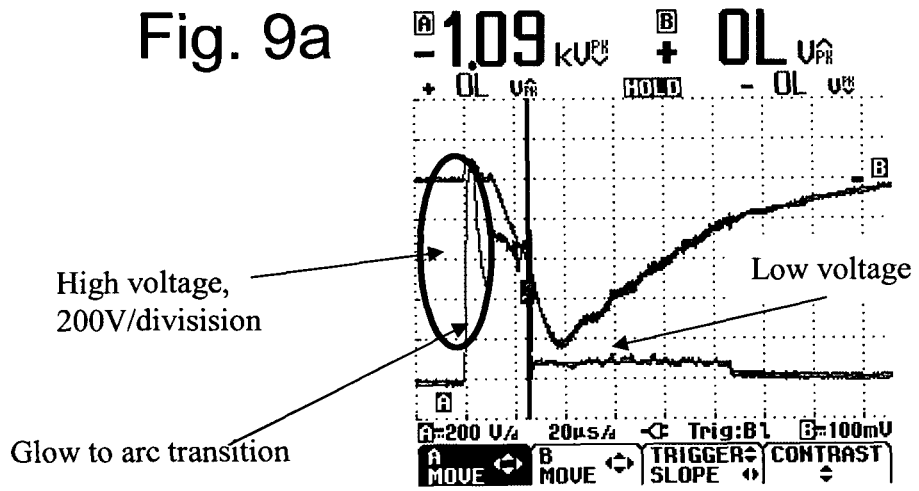
FIGS. 9a and 9b are diagrams of voltage and current traces in the plasma decomposition cells of FIGS. 1a and 1b before transition of a glow discharge to an arc discharge.
Figure 9B:
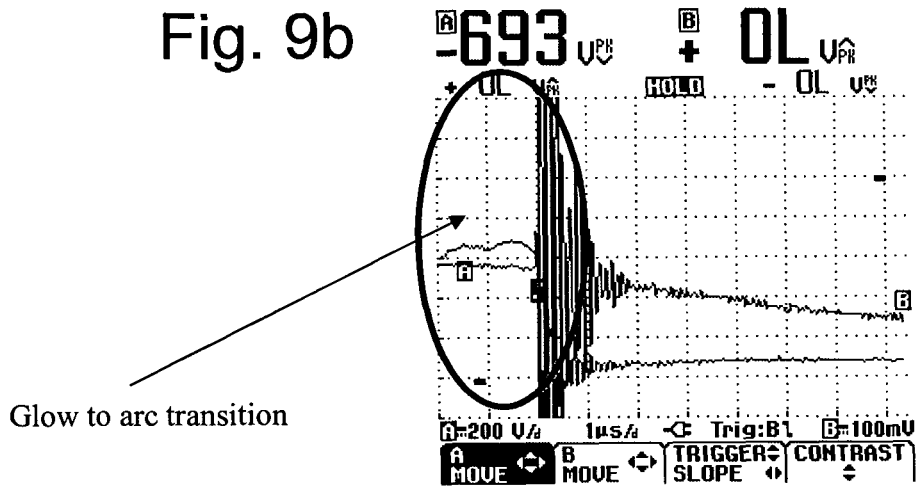

In an experimental investigation it was found that such a precursor exists and appears as high amplitude, high frequency oscillations of the discharge voltage and current, see the diagrams of FIGS. 9a and 9b. In FIGS. 9a and 9b the electric current and voltage traces before an arc will occur and after an arc has formed are shown. As can be seen, the oscillations happen before the discharge voltage drops. The characteristic voltage for glow discharges is in the range of hundreds of volts, for arc discharges it is in the range of a few tenths of volts and for the oscillations significantly higher than these voltages. In FIG. 9a the time scale is 20 microseconds/division and in FIG. 9b it is 1 microsecond/division. The measured frequency of the arc precursor oscillations is about some MHz, e.g. typically higher than 1 MHz. The basic arc suppression principle is to short connect the load, i.e. the decomposition unit, if high frequency oscillations happen or are expected to happen. The short connecting has to be commanded by the device producing the respective element pulse since it is in the circuit of that device that the high frequency oscillations can be detected.

Figure 10:
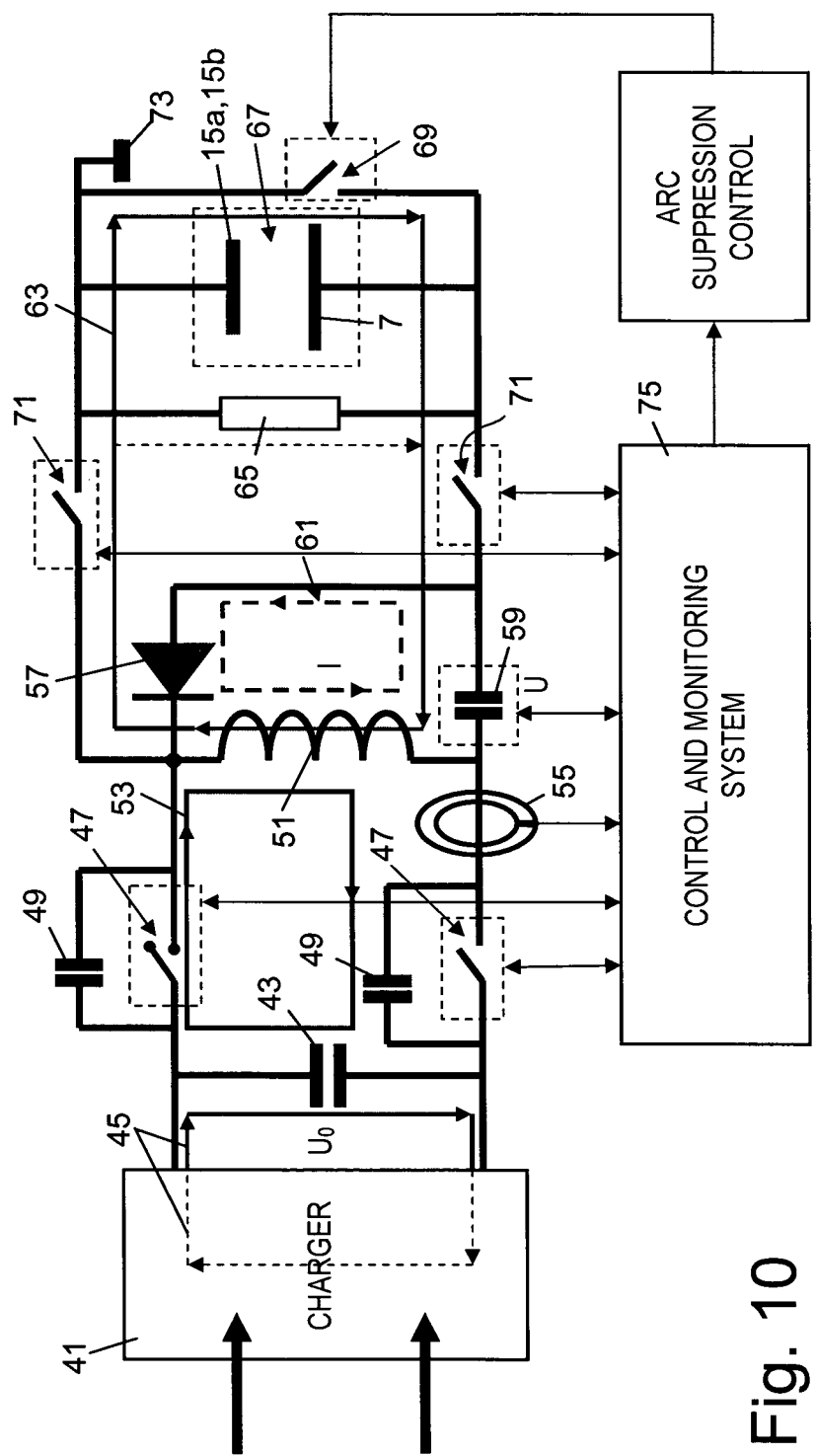
FIG. 10 is a circuit diagram of the electric components in a power supply unit for forming an element pulse.

A device for producing element pulses of the kinds described above is schematically shown in FIG. 10. It includes a charging device 41 that is connected to some input power line such as the general electric distribution network. It generates electric direct current and between its output terminals a stabilizing capacitor 43 is connected. The stabilizing capacitor is connected in a first closed circuit 45. The output terminals are also through controllable switches 47, each of which has a protecting capacitor 15 connected in parallel, connected to an accumulating inductor 51. The stabilizing capacitor, the switches and the inductor are connected in a second closed circuit 53. A current transformer 55 measures the electric current in the second circuit 53. The switches 47 are at their terminals which are connected to the inductor 51 also connected to a diode 57 and a discharge capacitor 59 connected in series with each other. The inductor 51, the diode 20 and the discharge capacitor are connected in a third closed circuit indicated at 61. A fourth closed circuit indicated at 63 is formed by a parallel combination of a resistor 65, the anode-cathode gap 67 between the anode 15a, 15b and the cathode 7 of the decomposition unit, and a short-circuiting switch 69, the parallel combination connected in parallel with the diode 57 through switches 71. The resistor 65 maintains these switches 71 that can be of semiconductor type in the regime "on" after a triggering pulse has been generated. The anode can be connected to electrical ground as seen at 73. A control and monitoring unit 75 is connected to all the switches 47, 71 and 69 and to the current transformer 55. A unit for arc suppression may be included or connected to the control and monitoring unit.

The element pulse generating device operates as follows. An element pulse, e.g. of the kind illustrated by the diagrams of FIGS. 4, 5a and 5, is formed by discharging the discharge capacitor 59 in the fourth circuit 63 over the discharge gap 67 of the decomposition cell through the inductor 51 and the closed switches 71. The discharge capacitor is then initially charged up to the energy $W_c = 0.5\, CU^2$ where C is the capacitance of the capacitor and U is the voltage over the capacitor. Before that the energy W has been injected into the inductor 51 as the energy of the magnetic field. For that electrical current was provided to the inductor from the charged stabilizing capacitor 43 by closing the switches 47. The energy of the magnetic field is $W_i = 0.5\, LI^2$ where L is the inductance of the inductor and I is the current flowing in the inductor. In order to transform the magnetic field energy $W_i$ into electric field energy $W_e$ of the capacitor the switches 47 are opened after the current in the inductor 51 has achieved the value I. This current then charges the discharge capacitor 59 in the third circuit 61. This current is simultaneously measured by the current transformer 55. The charging of the discharge capacitor 29 is started after the magnitude (the absolute value) of the current I has increased to a required or desired, set value, the switches 47 then opened.

The voltage U over the discharge capacitor 59 is then equal to $U = I(L/C)^{0.5}$. The stabilizing capacitor 43 is charged to the voltage $U_0$ by the charging device 41. The voltage U can be as high as necessary for the actual application. For example it can be 2 kV for pulsed PA CVD, or 20 kV for high voltage applications. The voltage $U_0$ can be 12 V that is typical for a car battery. The principle of the transformation of the low voltage $U_0$ into high voltage U is based on the intermediate transformation of energy of an electric field into magnetic field energy and then the opposite transformation back to electric field energy. The total circuit requires no high voltage transformer. Also the inductor 51 is used initially for charging the capacitor 29 and thereafter for forming the element pulse over the discharge gap 67. The short circuiting switch 26 is used to short connect the discharge gap of the decomposition or disintegration cell if a precursor, see FIGS. 9a, 9b, of arc forming is detected.

The operation of the total circuit is controlled and monitored by the control unit 28. The protective capacitors 49 are used to remove the over-voltages over the switches 47 when they are in a disconnecting period. The resistor 23 is chosen as high as necessary to maintain the switches 71 in a closed state after the triggered pulse has passed. It is necessary because a high voltage is applied to the discharge gap 67. The discharge will start after a certain time that is necessary for development of the glow discharge.

In the case of forming composite pulses from element pulses a plurality of circuits similar to that of FIG. 11a may connected in parallel to the anode 15a, 15b and the cathode 7 of the discharge gap. Then, some superior control unit, not shown, may be provided to give the times for starting the discharges for each such circuit. Otherwise, the element pulse generating circuits and in particular the control and monitoring systems thereof can be interconnected to give desired timing scheme.

The described principles of producing element pulses as well as composite rectangular pulses can be generally used in CVD for e.g. other designs of the electrode gap and they can be used also in other technical fields where there is a high risk of transformation of glow discharges, also called dark discharges, into arc discharges. It also can be used especially for running arc discharges.

While specific embodiments of the invention have been illustrated and described herein, it is realized that numerous other embodiments may be envisaged and that numerous additional advantages, modifications and changes will readily occur to those skilled in the art without departing from the spirit and scope of the invention. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention. Numerous other embodiments may be envisaged without departing from the spirit and scope of the invention.

The invention claimed is:

1. A method of plasma activated chemical vapour deposition comprising the steps of:
   providing a vacuum vessel having an operating pressure or vacuum in the range of from $10^{-4}$ to 10 Torr, to which an operating gas including a mixture of a decomposition or precursor gas, a reactive gas and/or a sputter gas, is provided,
   providing a plasma decomposition unit in or connected to the vacuum vessel for decomposing the operating gas having complex molecules into charged or neutral radicals, the plasma decomposition unit having an anode and a cathode, the cathode having an enhancing magnetic field and being electrically insulated from the surrounding anode,
   providing a work piece processing unit including a processing chamber, the processing chamber being identical to the vacuum vessel, a portion thereof or connected thereto,
   providing a work piece in the processing chamber,
   applying periodically repeated voltage pulses having a single polarity between the anode and the cathode of the plasma decomposition unit in such a manner that pulsed electric discharges are produced between the cathode and the surrounding anode of the plasma decomposition unit between the cathode and an inner surface of the surrounding anode of the plasma decomposition unit, thereby producing a plasma at a free surface of the cathode, comprising the additional step of:
   arranging the anode so that at least a portion thereof will obtain only an electrically conductive coating or substantially no coating so that the anode includes a surface portion shielded for direct coating with particles from the plasma formed wherein a tendency of transformation of a discharge from a glow discharge to an arc discharge is detected by appearance of high frequency oscillations of the discharge voltage.

2. A method according to claim 1, wherein the anode is arranged to include a surface portion facing or directed to a free surface of the cathode and located in parallel to said free surface, the surface portion being located on a first anode portion placed between said free surface and the plasma formed, the surface portion thereby shielded for direct coating with particles from the plasma.

3. A method according to claim 2, wherein the anode includes a second portion located at edges of the cathode, the first anode portion being part of or directly extending from the second anode portion to be placed over or covering a margin portion of the free surface of the cathode as seen from a point placed at a distance of said free surface.

4. A method according to claim 1, wherein in applying the periodically repeated voltage pulses, each of the voltage pulses is generated from a composite current pulse having a substantially rectangular shape, the composite current pulse formed by adding low power current pulses to each other.

5. A method according to claim 4, wherein the added low power current pulses have a shape with a sharp peak having a length shorter than one fifth or one tenth of the composite current pulse.

6. A method according to claim 4, wherein a generator is provided for producing the current pulses that are added, the generator comprising a line of transformation of incoming power initially into energy of an electric field, thereafter into energy of a magnetic field, and finally into energy of an electric field.

7. A method according to claim 1, wherein an arc suppression is made by short connecting the anode and cathode of the plasma decomposition unit before an actual occurrence of an arc.

8. A method according to claim 1, wherein the high frequency oscillations of the discharge voltage are greater than 1 MHz.

9. A method according to claim 1, wherein the high frequency oscillations of the discharge voltage are measurable in Megahertz (MHz).

10. A method of plasma activated chemical vapour deposition comprising the steps of:
    providing a vacuum vessel having a pressure or vacuum in the range of from $10^{-4}$ to 10 Torr, to which an operating gas including a mixture of a decomposition or precursor gas, a reactive gas and/or a sputter gas, is provided,
    providing a plasma decomposition unit in or connected to the vacuum vessel for decomposing the operating gas having complex molecules into charged or neutral radicals, the plasma decomposition unit having an anode and a cathode, the cathode having an enhancing magnetic field and being electrically insulated from the surrounding anode,
    providing a work piece processing unit including a processing chamber, the processing chamber being identical to the vacuum vessel, a portion thereof or connected thereto,
    providing a work piece in the processing chamber,
    applying periodically repeated voltage pulses having a single polarity between the anode and the cathode of the plasma decomposition unit in such a manner that pulsed electric discharges are produced between the cathode and the surrounding anode of the plasma decomposition unit between the cathode and an inner surface of the surrounding anode of the plasma decomposition unit, thereby producing a plasma at a free surface of the cathode, comprising the additional step of:
    detecting a tendency of transformation of a discharge from a glow discharge to an arc discharge by appearance of high frequency oscillations of the discharge voltage obtained when applying the periodically repeated voltage pulses.

11. A method according to claim 10, wherein when detecting a tendency of transformation of a discharge from a glow discharge to an arc discharge, arc suppression is made by short connecting the anode and cathode of the plasma decomposition unit before an actual occurrence of an arc.

12. A method according to claim 10, wherein the high frequency oscillations of the discharge voltage are greater than 1 MHz.

13. A method according to claim 10, wherein the high frequency oscillations of the discharge voltage are measurable in Megahertz (MHz).

* * * * *